US008547693B2

(12) United States Patent
Chen et al.

(10) Patent No.: US 8,547,693 B2
(45) Date of Patent: Oct. 1, 2013

(54) MOUNTING APPARATUS FOR FAN (75) Inventors: Yun-Lung Chen, Tu-Cheng (TW); Da-Long Sun, Shenzhen (CN); Jun-Pu Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 362 days.

(21) Appl. No.: 13/014,293

(22) Filed: Jan. 26, 2011

(65) Prior Publication Data
US 2012/0033376 A1 Feb. 9, 2012

(30) Foreign Application Priority Data

Aug. 3, 2010 (CN) .......................... 2010 1 0243847

(51) Int. Cl.
*H05K 7/20* (2006.01)
*G06F 1/20* (2006.01)
*F24H 3/02* (2006.01)
*H05K 5/00* (2006.01)
*H01L 23/467* (2006.01)

(52) U.S. Cl.
CPC ................. *G06F 1/20* (2013.01); *H01L 23/467* (2013.01); *H05K 7/20172* (2013.01)
USPC ................... 361/679.5; 361/679.49; 361/695; 454/184; 415/206; 165/121; 165/126

(58) Field of Classification Search
USPC ....... 361/679.46–679.54, 688–723; 454/184; 415/206; 165/121, 126
See application file for complete search history.

(56) References Cited

U.S. PATENT DOCUMENTS

| 6,002,586 | A | * | 12/1999 | Chen et al. ..................... 361/695 |
| 6,322,042 | B1 | * | 11/2001 | Nemec .......................... 248/694 |
| 6,464,578 | B1 | * | 10/2002 | Chin et al. ..................... 454/184 |
| 6,643,131 | B1 | * | 11/2003 | Huang ........................... 361/697 |
| 6,822,863 | B1 | * | 11/2004 | Artman et al. ................ 361/695 |
| 6,970,353 | B2 | * | 11/2005 | Brovald et al. ............ 361/679.5 |
| 7,643,292 | B1 | * | 1/2010 | Chen ............................. 361/695 |
| 7,661,923 | B2 | * | 2/2010 | Kosugi .......................... 415/118 |
| 2006/0023419 | A1 | * | 2/2006 | Kao et al. ...................... 361/690 |
| 2011/0317362 | A1 | * | 12/2011 | Chen ............................. 361/695 |

\* cited by examiner

*Primary Examiner* — Zachary M Pape (74) *Attorney, Agent, or Firm* — Altis & Wispro Law Group, Inc.

(57) ABSTRACT

A mounting apparatus includes a first bracket and a second bracket. Two guides are located on the first bracket. A locking block is located on the first bracket between the two guides. The second bracket receives a first fan. Two sliding portions are located on the second bracket and engaged with the two guides. A latch is resiliently deformable and located on the second bracket between the two sliding portions. A plurality of receiving holes is defined in the latch. The second bracket is slidable between the two guides relative to the first bracket. The locking block is can engage in the plurality of receiving holes to secure the first bracket to the second bracket in a plurality of positions.

20 Claims, 8 Drawing Sheets

MOUNTING APPARATUS FOR FAN

BACKGROUND

1. Technical Field

The present disclosure relates to a mounting apparatus for a fan.

2. Description of Related Art

A fan is typically secured to a computer enclosure in a predetermined position, which cannot be changed. Therefore, there is room for improvement in the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
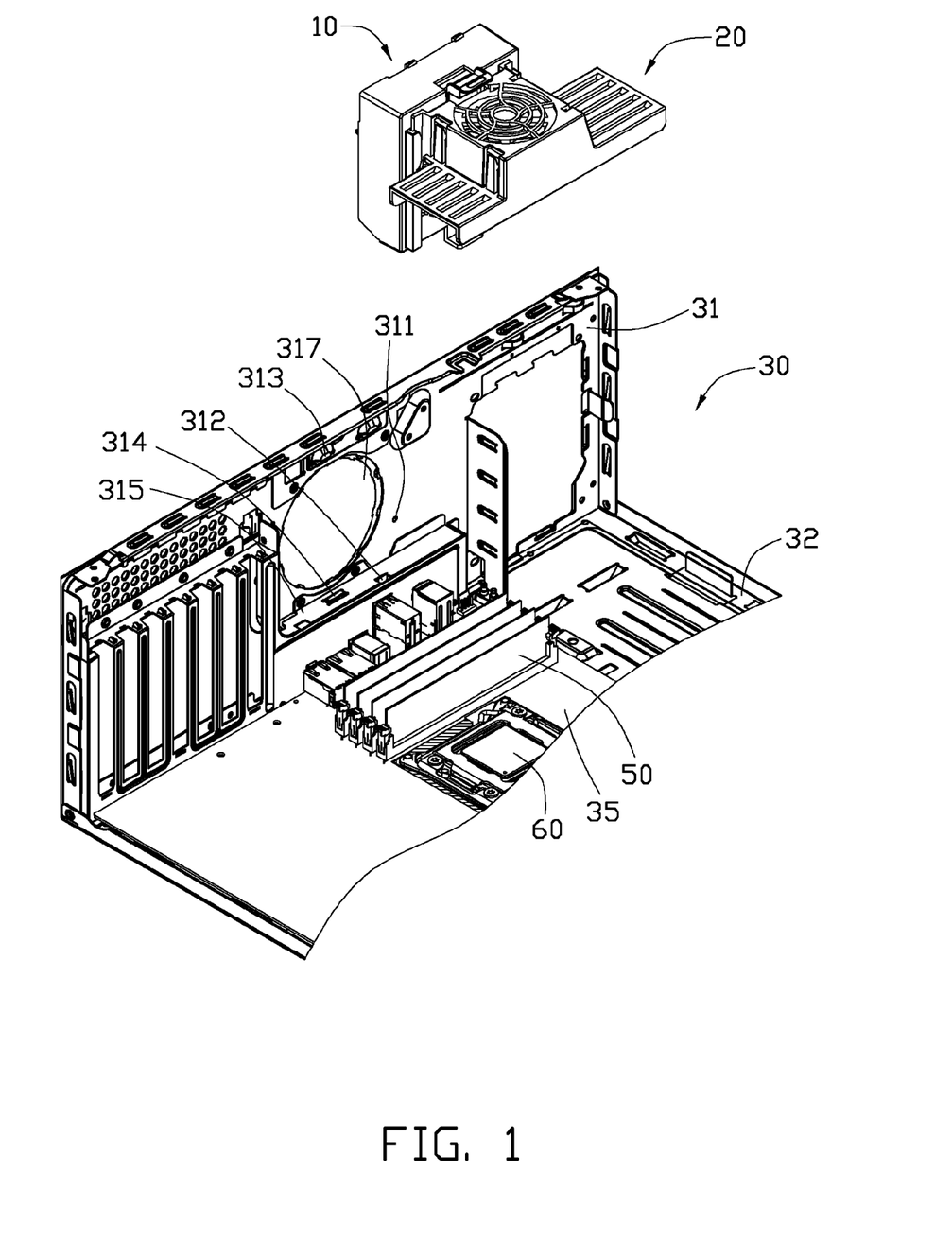
FIG. 1 is an exploded, isometric view of a mounting apparatus for a fan in accordance with an embodiment.

Referring to FIG. 1, a mounting apparatus in accordance with an embodiment includes a chassis 30, a first bracket 10, and a second bracket 20.

The chassis 30 includes a bottom plate 32 and a side plate 31. The side plate 31 is substantially perpendicular to the bottom plate 32. The side plate 31 defines a through opening 317. Two positioning portions 313 are located on the side plate above the through opening 317. A support portion 315 is located on the side plate 31 below the through opening 317. Two locking holes 312 are defined in the support portion 315, and a resilient piece 314 is located on the support portion 315 between the two locking holes 312. Two positioning holes 311 are defined in the side plate 31 on two opposite sides of the through opening 317 between the two positioning portions 313 and the support portion 315.

A motherboard 35 is secured to a top surface of the bottom plate 32. A plurality of memory cards 50 and a CPU 60 are installed on the motherboard 35, adjacent the side plate 31. The memory cards 50 are substantially parallel to the side plate 31 and located between the CPU 60 and the side plate 31.

Figure 2:
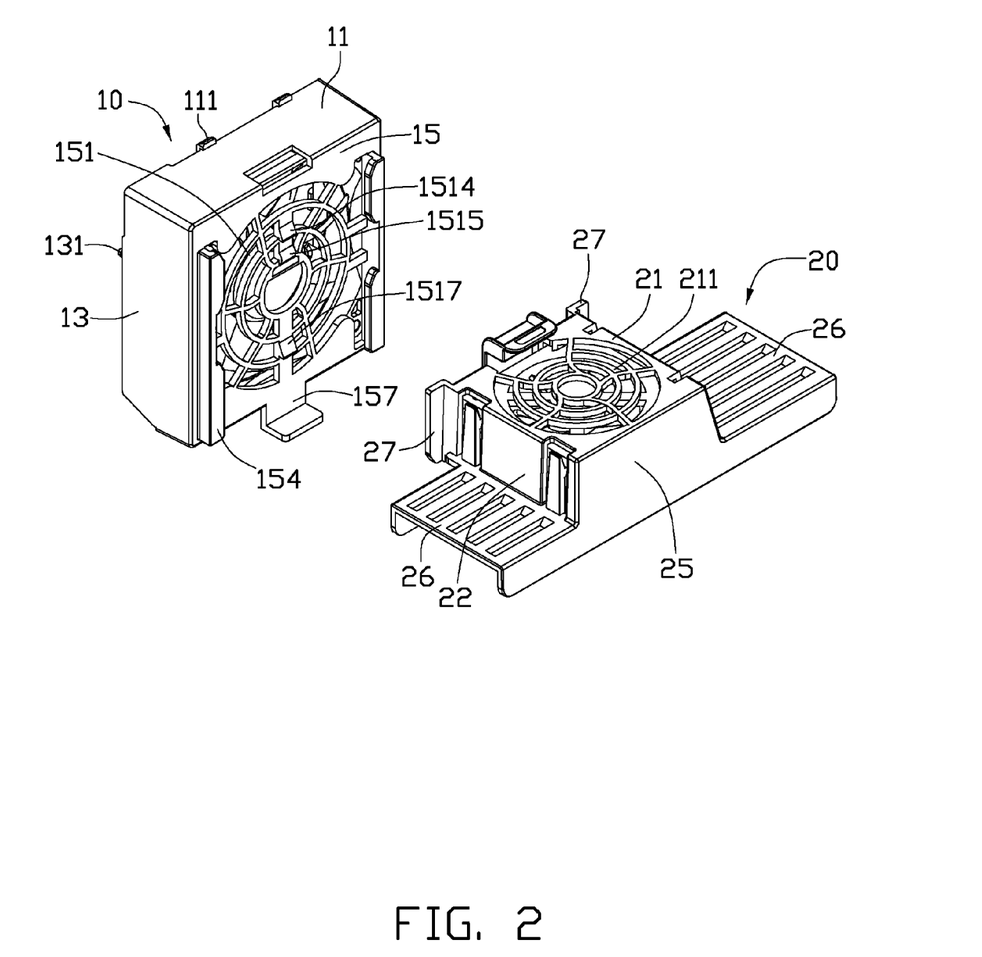
FIG. 2 is an exploded, isometric view of a first bracket and a second bracket of the mounting apparatus of FIG. 1.
Figure 5:
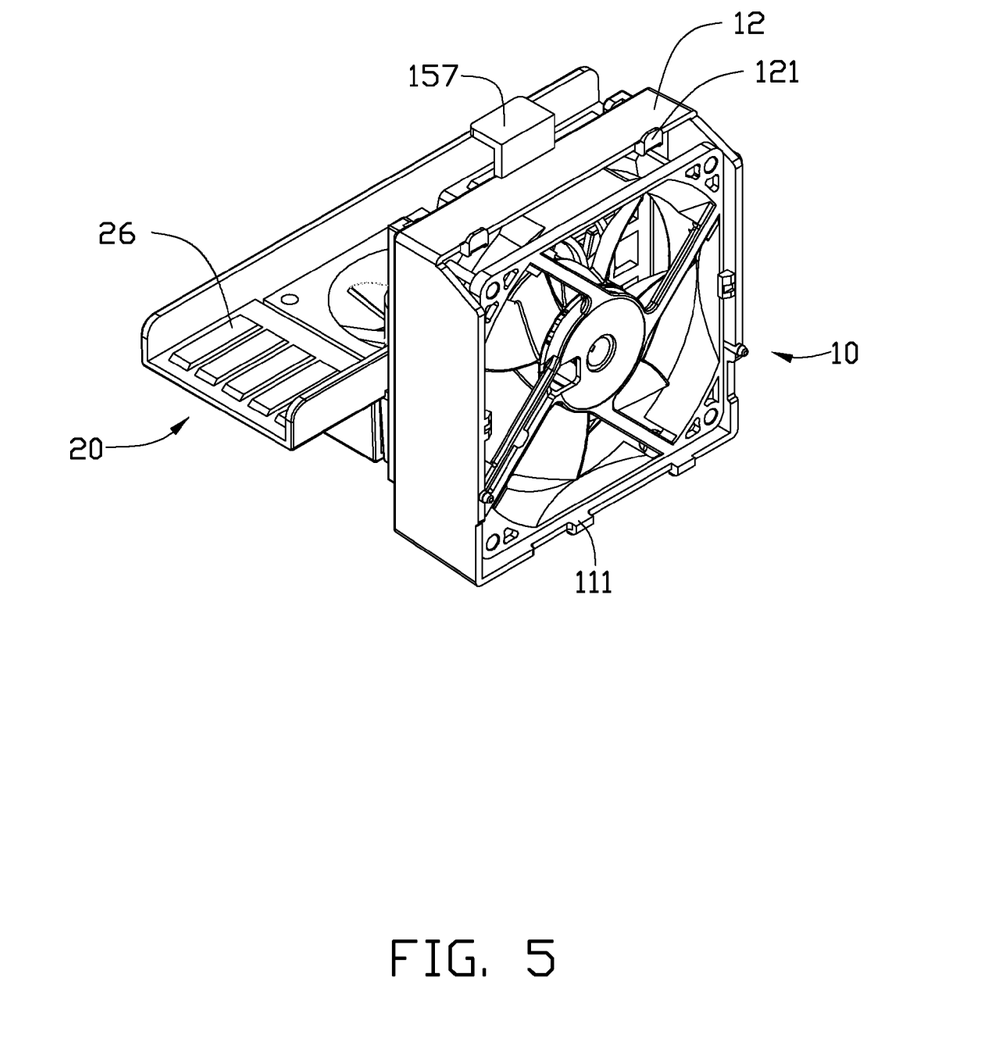
FIG. 5 is similar to FIG. 4, but viewed from another aspect.

Referring to FIG. 2, the first bracket 10, configured for receiving a first fan (not labeled), includes a top wall 11, two first sidewalls 13, a second sidewall 15, and a bottom wall 12 (shown in FIG. 5). In one embodiment, the top wall 11 is substantially perpendicular to the first sidewalls 13 and the second sidewall 15 and substantially parallel to the bottom wall 12; and the first sidewalls 13 are substantially perpendicular to the second sidewall 15. Two locking tabs 111 are located on the top wall 11, configured for engaging with the positioning portions 313 of the side plate 31. A positioning post 131 is located on each first sidewall 13, and the positioning posts 131 are configured for engaging in the positioning holes 311 of the side plate 31. A first vent area 151 with a plurality of first rounded slits is defined in the second sidewall 15. Two guides 154 are located on the second sidewall 15 between opposite sides of the first vent area 151. In one embodiment, each guide 154 has an L-shaped cross-section. A first locking block 1514, a second locking block 1515, and a third locking block 1517 are located on the second sidewall 15 between the two guides 154. In one embodiment, the first locking block 1514, the second locking block 1515, and the third locking block 1517 are arranged in a line, which is substantially parallel to the first sidewall 13. A blocking piece 157 extends from the second sidewall 15. In one embodiment, the blocking piece 157 is substantially L-shaped and arranged in the line with the first to third locking blocks 1514, 1515, 1517. Referring to FIG. 5, two positioning tabs 121, located on the bottom wall 12, are configured for engaging in the locking holes 312 of the side plate 31.

Figure 3:
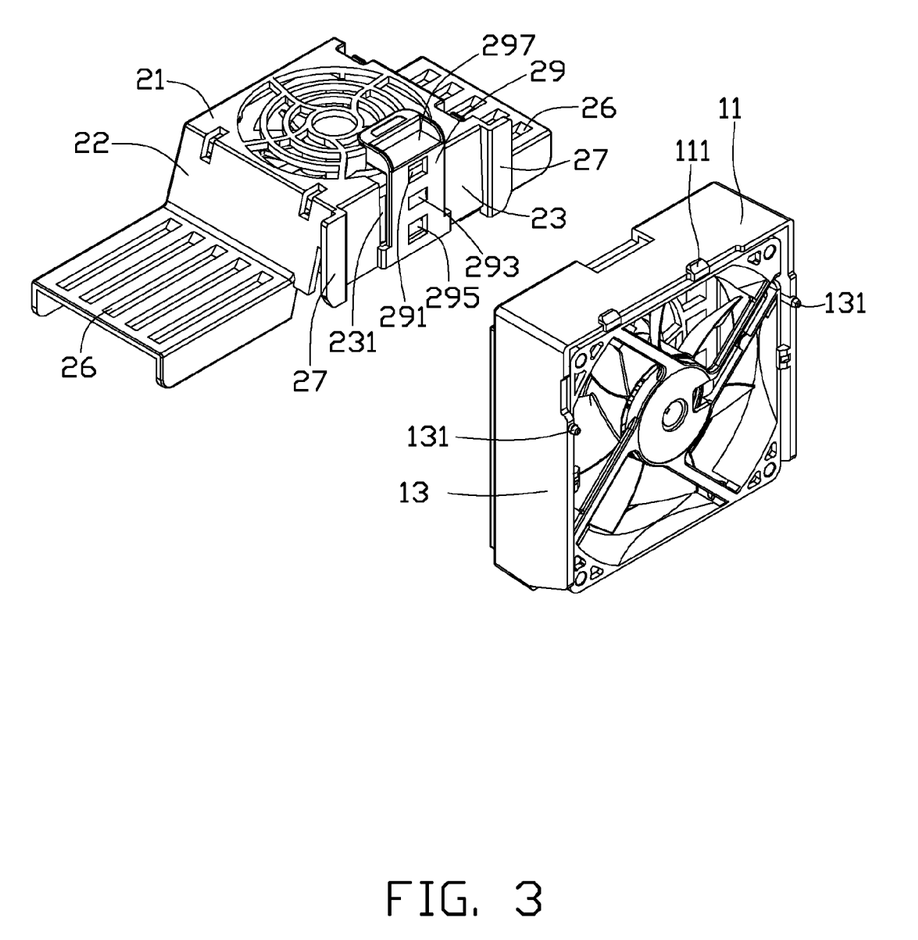
FIG. 3 is similar to FIG. 2, but viewed from another aspect.

Referring to FIGS. 2-3, the second bracket 20, configured for receiving a second fan (not labeled), includes a top panel 21, two first side panels 22, a second side panel 23, a third side panel 25, and a bottom panel 26. The top panel 21 is substantially parallel to the bottom panel 26 and perpendicular to the first side panels 22. The second side panel 23 is substantially perpendicular to the third side panel 25 and substantially perpendicular to the first side panels 22. A second vent area 211 with a plurality of second rounded slits is defined in the top panel 21. A slot 231 is defined in the second side panel 23, extending to the top panel 21. A latch 29 extends from the second side panel 23 in the slot 231. The latch 29 is resiliently deformable and includes an operating portion 297 located in a portion of the slot 231 in the top panel 21. A first receiving hole 291, a second receiving hole 293, and a third receiving hole 295 are defined in the latch 29, for respectively receiving the first locking block 1514, the second locking block 1515, and the third locking block 1517. Two sliding portions 27 extend from the joints of the first side panels 22 and the second side panel 23, configured for slidably engaging with the guides 154 of the first bracket 10.

Figure 4:
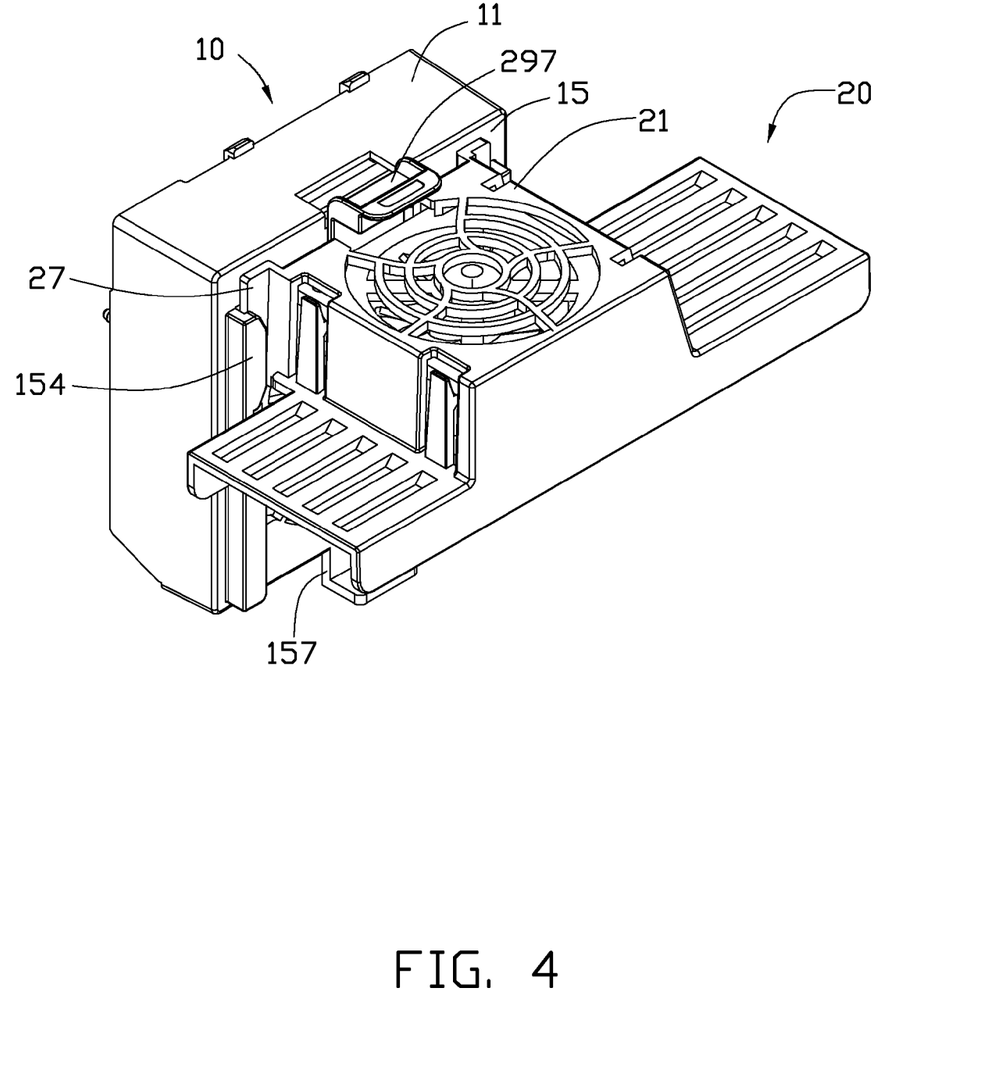
FIG. 4 is an assembled view of FIG. 2.

Referring also to FIG. 4, in assembly, the sliding portions 27 are slidably engaged with the guides 154. The second bracket 20 is slid down relative to the first bracket 10, until the latch 29 touches the first locking block 1514. The second bracket 20 is pressed down, and the latch 29 is pressed by the first locking block 1514 and resiliently deformed, until the latch 29 can be slid across the first locking block 1514. When the third receiving hole 295 aligns with the first locking block 1514, the latch 29 rebounds to engage the first locking block 1514 in the third receiving hole 295. The second bracket 20 is located in first position.

Figure 6:
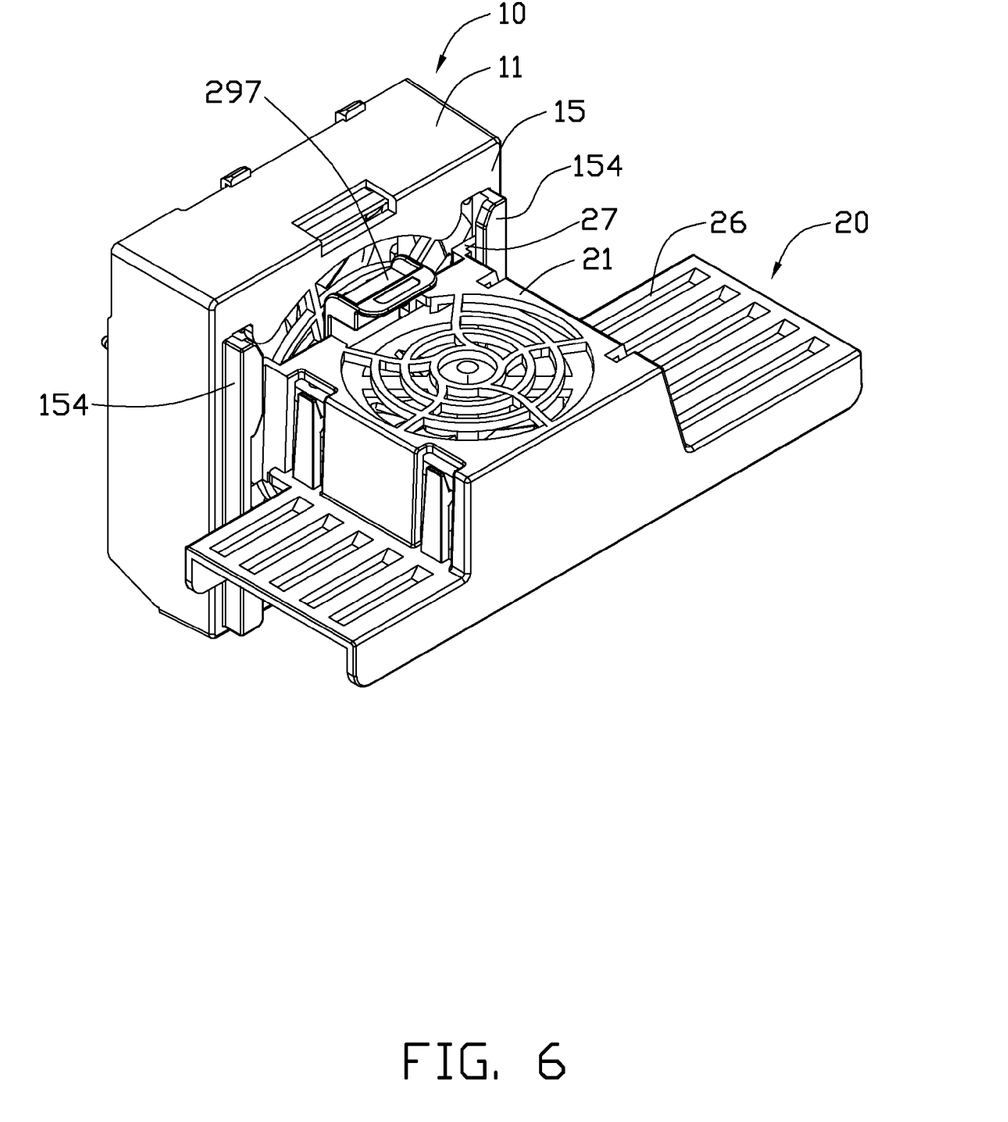
FIG. 6 is similar to FIG. 4, and shows the second bracket in a different position.

Referring also to FIGS. 5-6, when the second bracket 20 is further pressed to slide down, the latch 29 is pressed by the first and second locking blocks 1514, 1515 and resiliently deformed. The first locking block 1514 is disengaged from the third receiving hole 295. When the first locking block 1514 is aligned with the second receiving hole 293 and the second locking block 1515 is aligned with the third receiving hole 295, the latch 29 rebounds to engage the second locking block 1515 in the second receiving hole 293 and the second locking block 1515 in the third receiving hole 295. The second bracket 20 is located in the second position.

When the second bracket 20 is further pressed to slide down, the latch 29 is pressed by the first, second and third locking blocks 1514, 1515, 1517 and resiliently deformed. The first locking block 1514 is disengaged from the second receiving hole 293, and the second locking block 1515 is disengaged from the third receiving hole 295. When the first locking block 1514 is aligned with the first receiving hole 291 and the second locking block 1515 is aligned with the second receiving hole 293, the latch 29 rebounds to engage the first locking block 1514 in the first receiving hole 291 and the second locking block 1515 in the second receiving hole 293. The second bracket 20 is located in the third position.

Figure 7:
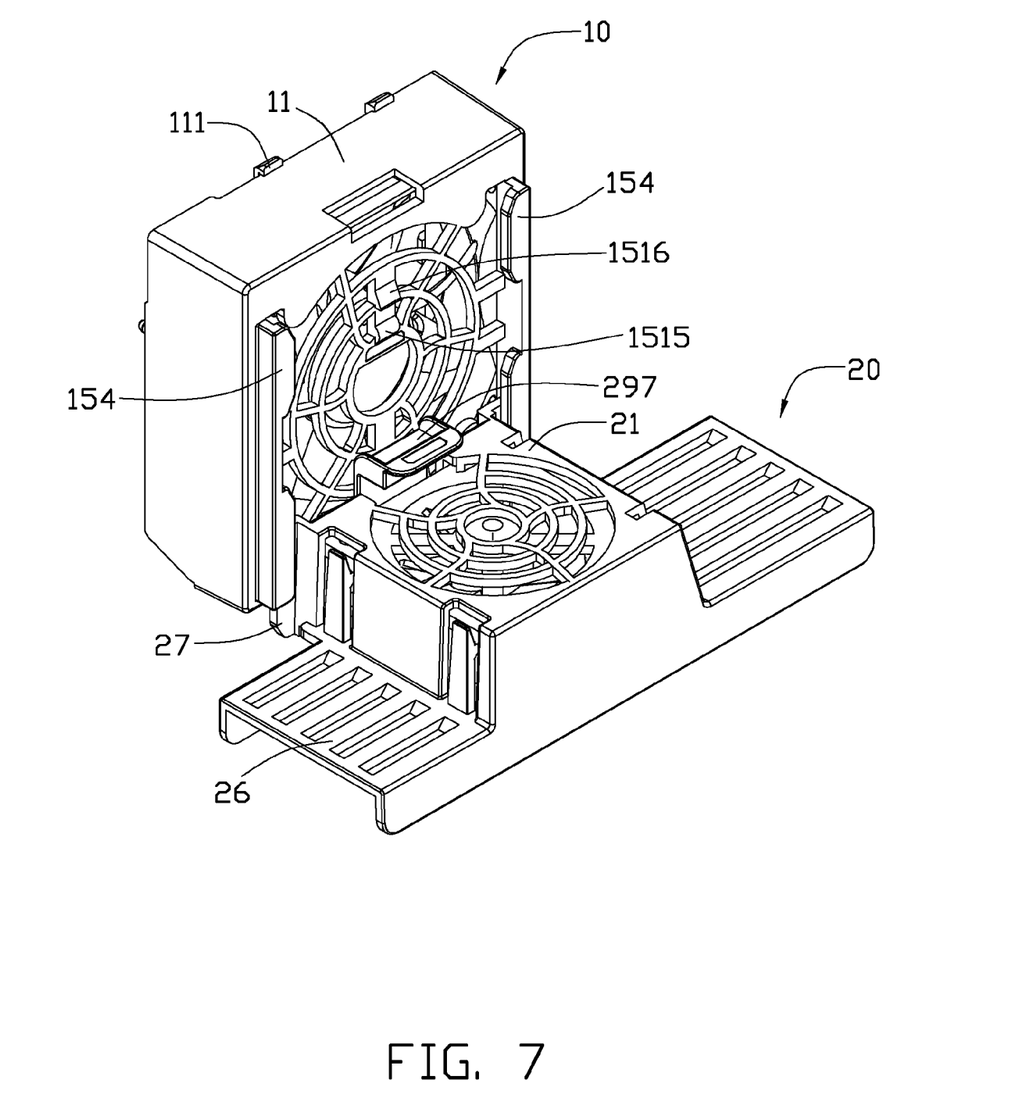
FIG. 7 is similar to FIG. 6, and shows the second bracket in a different position.

Referring also to FIG. 7, the second bracket 20 can be further slid down relative to the first bracket 10, until the second bracket 20 is supported on the blocking piece 157, and the third locking block 1517 is engaged in the second receiving hole 293.

Figure 8:
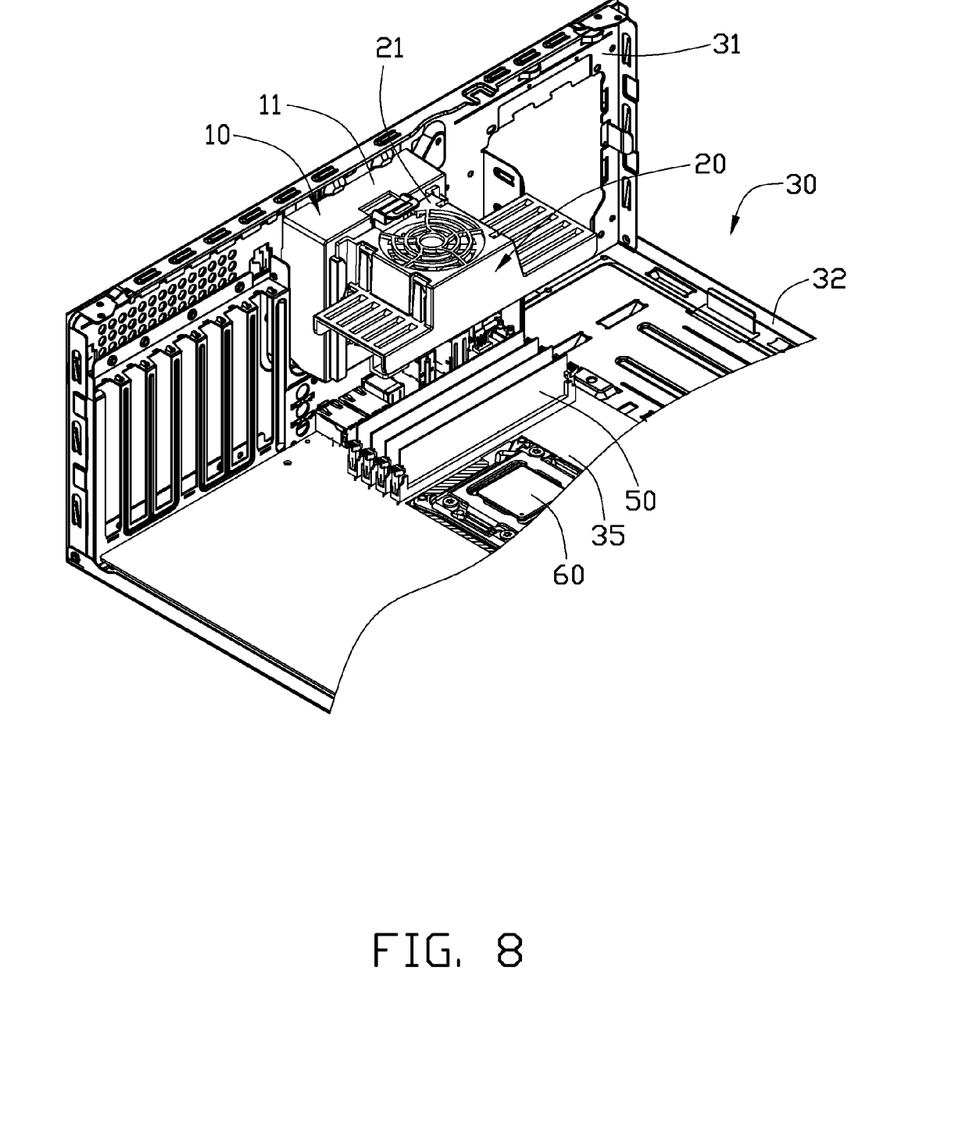
FIG. 8 is an assembled view of FIG. 1.

Referring also to FIG. 8, the second bracket 20 is secured to the first bracket 10 and the first bracket 10 is secured to the side plate 31. The positioning tabs 121 of the first bracket 10 are engaged in the locking holes 312. The positioning posts 131 of the first bracket 10 are inserted in the positioning holes 311 of the side plate 31. The locking tabs 111 of the first bracket 10 are engaged with the positioning portions 313 of the side plate 31. The second bracket 20 is located above the memory cards 50. Since a distance between the second bracket 20 and the memory cards 50 can be adjusted by sliding the second bracket 20 relative to the first bracket 10, the fan secured in the second bracket 20 can be configured to dissipate heat generated from the different cards, which have different heights.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. A mounting apparatus comprising:
   a chassis; a motherboard received in the chassis, and a memory card attached to the motherboard;
   a first bracket, two guides located on the first bracket, a locking block located on the first bracket between the two guides; and
   a second bracket configured for receiving a first fan, two sliding portions located on the second bracket and engaged with the two guides, a latch being resiliently deformable and located on the second bracket between the two sliding portions, and a plurality of receiving holes defined in the latch;
   wherein the second bracket is slidable between the two guides relative to the first bracket in a first direction that is substantially perpendicular to a major surface of the motherboard, the locking block is configured to engage the plurality of receiving holes to secure the first bracket to the second bracket in a plurality of positions, so that a distance between the memory card and the second bracket along the first direction is adjusted.

2. The mounting apparatus of claim 1, wherein a blocking piece is located on the first bracket to prevent the two sliding portions from moving away from the two guides.

3. The mounting apparatus of claim 1, wherein the first bracket comprises a top wall, two first sidewalls, a second sidewall, and a bottom wall; the top wall, the two first sidewalls and the bottom wall are located on edges of the second sidewall, and together with the second sidewall define a space configured for receiving a second fan.

4. The mounting apparatus of claim 3, wherein the second bracket comprises a top panel, two first side panels, a second side panel and a third side panel; the two first side panels, the second side panel and the third side panel are connected to the top panel, and together with the top panel define a room configured for receiving the first fan; the first fan is substantially perpendicular to the second fan, and the top panel is substantially perpendicular to the second sidewall of the first bracket.

5. The mounting apparatus of claim 4, wherein the chassis comprises a bottom plate and a side plate that is perpendicular to the bottom plate, the first bracket secured to the side plate; and the second sidewall of the first bracket substantially parallel to the side plate, and the top panel of the second bracket is substantially parallel to the bottom plate.

6. The mounting apparatus of claim 5, wherein a positioning portion is located on the side plate; a locking hole is defined in the side plate; a locking tab is located on the top wall of the first bracket; a positioning tab is located on the bottom wall of the first bracket; and the locking tab is engaged with the positioning portion, and the positioning tab is engaged in the locking hole.

7. The mounting apparatus of claim 6, wherein a support portion is located on the side plate, the locking hole is defined in the support portion; and a resilient piece is located on the support portion and abuts the bottom wall of the first bracket.

8. The mounting apparatus of claim 5, wherein the side plate defines a positioning hole; and a positioning post is located on the first bracket and engaged in the positioning hole.

9. The mounting apparatus of claim 5, wherein the memory card is substantially parallel to the side plate of the chassis; the second bracket further comprising a bottom panel extending out from opposite edges of the two first side panels; and the bottom panel is positioned above the memory card.

10. The mounting apparatus of claim 5, wherein the second sidewall of the first bracket defines a first vent area with a plurality of through holes between the two guides, and the top panel of the second bracket defines a second vent area with a plurality of second rounded slits.

11. A mounting apparatus comprising:
    a chassis; a motherboard received in the chassis, and a memory card attached to the motherboard;
    a first bracket, a first fan received in the first bracket; two guides located on the first bracket, a plurality of locking blocks located on the first bracket between the two guides; and
    a second bracket a second fan received in the bracket, two sliding portions located on the second bracket and engaged with the two guides to prevent the second bracket from moving away from the first bracket, a latch being resiliently deformable and located on the second bracket between the two sliding portions, and the latch defining a receiving hole;
    wherein the second bracket is slidable relative to the first bracket in a first direction that is substantially perpendicular to a major surface of the motherboard, the plurality of locking blocks are respectively engaged in the receiving hole to secure the first bracket to the second bracket in a plurality of positions, a distance between the memory card and the second bracket along the first direction is adjusted, and a direction of air flowing through the first fan is substantially perpendicular to a direction of air flowing through the second fan.

12. The mounting apparatus of claim 11, wherein a blocking piece is located on the first bracket to prevent the two sliding portions moving away from the two guides.

13. The mounting apparatus of claim 11, wherein the first bracket comprises a top wall, two first sidewalls, a second sidewall, and a bottom wall; the top wall, the two first sidewalls and the bottom wall are located on edges of the second sidewall, and together with the second sidewall define a space configured for receiving a second fan.

14. The mounting apparatus of claim 13, wherein the second bracket comprises a top panel, two first side panels, a second side panel, and a third side panel; the two first side panels, the second side panel, and the third side panel are connected to the top panel and together with the top panel define a room configured for receiving the second fan; and the top panel of the second bracket is substantially perpendicular to the second sidewall of the first bracket.

15. The mounting apparatus of claim 14, wherein the chassis comprises a bottom plate and a side plate that is perpendicular to the bottom plate, and the first bracket is secured to the side plate; and the second sidewall of the first bracket substantially parallel to the side plate, and the top panel of the second bracket is substantially parallel to the bottom plate.

16. The mounting apparatus of claim 15, wherein a positioning portion is located on the side plate; a locking hole is defined in the side plate; a locking tab is located on the top wall of the first bracket; a positioning tab is located on the bottom wall of the first bracket; and the locking tab is engaged with the positioning portion, and the positioning tab is engaged in the locking hole.

17. The mounting apparatus of claim 16, wherein a support portion is located on the side plate, the locking hole is defined in the support portion; and a resilient piece is located on the support portion and abuts the bottom wall of the first bracket.

18. The mounting apparatus of claim 15, wherein the side plate defines a positioning hole; and a positioning post is located on the first bracket and engaged in the positioning hole.

19. The mounting apparatus of claim 15, wherein the memory card is substantially parallel to the side plate of the chassis; the second bracket further comprising a bottom panel extending out from opposite edges of the two first side panels; and the bottom panel is positioned above the memory card.

20. The mounting apparatus of claim 15, wherein the second sidewall of the first bracket defines a first vent area with a plurality of first slits between the two guides, and the top panel of the second bracket defines a second vent area with a plurality of second rounded slits, the restricting room receives the sliding member, and the sliding member abuts the shielding panel.

* * * * *